(12) United States Patent
Lee et al.

(10) Patent No.: US 8,802,536 B2
(45) Date of Patent: Aug. 12, 2014

(54) PHASE-CHANGE MEMORY DEVICE AND METHOD OF FABRICATING THE SAME

(71) Applicant: SK hynix Inc., Gyeonggi-do (KR)

(72) Inventors: Keun Lee, Gyeonggi-do (KR); Jin Hyock Kim, Gyeonggi-do (KR); Young Seok Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/920,656

(22) Filed: Jun. 18, 2013

(65) Prior Publication Data

US 2013/0280880 A1     Oct. 24, 2013

Related U.S. Application Data

(62) Division of application No. 12/962,183, filed on Dec. 7, 2010, now Pat. No. 8,508,021.

(30) Foreign Application Priority Data

Jul. 6, 2010 (KR) .......................... 10-2010-0064868

(51) Int. Cl.
*H01L 45/00* (2006.01)

(52) U.S. Cl.
CPC ............ *H01L 45/1683* (2013.01); *H01L 45/06* (2013.01); *H01L 45/1233* (2013.01); *H01L 45/144* (2013.01); *H01L 45/1616* (2013.01); *H01L 45/1641* (2013.01)
USPC ................................... 438/385; 257/E45.002

(58) Field of Classification Search
CPC .................................................... H01L 45/1683
USPC .......................................................... 257/537
See application file for complete search history.

(56) References Cited

U.S. PATENT DOCUMENTS

| | | | |
|---|---|---|---|
| 2006/0040485 A1* | 2/2006 | Lee et al. | 438/597 |
| 2009/0097305 A1* | 4/2009 | Bae et al. | 365/163 |
| 2009/0189139 A1* | 7/2009 | Schrott et al. | 257/3 |
| 2010/0051895 A1* | 3/2010 | Hampton | 257/4 |

\* cited by examiner

*Primary Examiner* — Stephen W Smoot
(74) *Attorney, Agent, or Firm* — IP & T Group LLP

(57) ABSTRACT

A phase-change memory device with improved deposition characteristic and a method of fabricating the same are provided. The phase-change memory device includes a semiconductor substrate having a phase-change area, a first material-rich first phase-change layer forming an inner surface of the phase-change area and comprised of a hetero compound of the first material and a second material, and a second phase-change layer formed on a surface of the first phase-change layer to fill the phase-change area.

16 Claims, 2 Drawing Sheets

PHASE-CHANGE MEMORY DEVICE AND METHOD OF FABRICATING THE SAME

CROSS-REFERENCES TO RELATED APPLICATION

This application is a division of U.S. patent application Ser. No. 12/962,183 filed on Dec. 7, 2010 and issued as U.S. Pat. No. 8,508,021, which claims priority under 35 U.S.C. 119(a) to Korean Application number 10-2010-0064868, filed on Jul. 6, 2010. The disclosure of each of the foregoing applications is incorporated herein by reference in its entirety.

BACKGROUND OF THE INVENTION

1. Technical Field

The embodiments described herein relate to a phase-change memory device and a method of fabricating the same and, more particularly, to a phase-change memory device including a phase-change layer with improved deposition property aid a method of fabricating the same.

2. Related Art

As IT technologies develop, demand for next generation semiconductor memory devices with ultra-high speed and large capacity, which are suitable for portable information communication systems and appliances, increases. It is desirable that the next generation semiconductor memory devices have the non-volatile properties of flash memory devices, the high speed operation of static random access memories (SRAMs), and the high integration degree of dynamic RAMs (DRAMs), while achieving a lower power consumption.

As the next generation semiconductor memory devices, ferroelectric RAMS (FRAMs), magnetic RAMs (MRAMs), phase-change RAMS (PRAMS) or nano floating gate memories (NFGMs), which have lower power consumption and excellent data retention and write/read characteristics as compared with conventional memory devices, have been researched, Among these next generation semiconductor memory devices, as the PRAMs having a simple structure can be fabricated at a lower cost and operate at a high speed, the PRAMS are being heavily studied.

The PRAM includes a phase-change layer of which a crystal state is changed depending on the heat produced by an applied current. A chalcogenide (GST) based material which is comprised of germanium (Ge), antimony (Sb) and tellurium (Te) is typically used as the phase-change layer of the PRAM. The crystal state of the phase-change layer such as a GST layer is changed by the heat produced according to an intensity of a supplied current and a current supply time. The phase-change layer has a higher resistivity at an amorphous state and a lower resistivity at a crystalline state such that it may be used as a data storage medium of a memory device.

The phase-change layer is easily changed from the amorphous state to the crystalline state due to its crystallization characteristic. However, the conversion from the crystalline state to the amorphous state may consume a large amount of current. The current for the phase-change layer in converting from the crystalline state to the amorphous state is called as a reset current. Methods for reducing the reset current in the PRAM have been suggested.

The method of forming the phase-change layer in a confined structure has been suggested to reduce the reset current. The phase-change layer is buried within a phase-change area of a hole type in the confined structure to improve phase-change efficiency, thus reducing the reset current, However, in order to deposit the phase-change layer of the confined structure, the phase-change layer is to have selectivity with respect to the deposition. As known, the GST layer which is a typical phase-change layer has a high deposition selectivity. Accordingly, when the GST layer is applied to the confined structure, the GST layer may not be uniformly deposited within the hole, and thus it is difficult to fill the hole with the GST layer. Accordingly, the phase-change layer may not be uniformly formed within the phase-change area to cause a void such as a seam or an open fail.

SUMMARY

According to an exemplary embodiment, a phase-change memory device includes a semiconductor substrate having a phase-change area, a first material-rich first phase-change layer formed along an inner surface of the phase-change area and comprised of a hetero compound of the first material and a second material, and a second phase-change layer formed on a surface of the first phase-change layer to fill the phase-change area.

According to another exemplary embodiment, a method of fabricating a phase-change memory device includes forming a phase-change area exposing a lower electrode formed on a semiconductor substrate, uniformly forming a first material-rich first phase-change layer comprised of a hetero compound of the first-material and a second material along an inner surface of the phase-change area, and forming a second phase-change layer on a surface of the first phase-change layer to fill the phase-change area, These and other features, aspects, and embodiments are described below in the section entitled "DESCRIPTION OF EXEMPLARY EMBODIMENTS".

BRIEF DESCRIPTION OF THE DRAWINGS

The above and other aspects, features and advantages of the subject matter of the present disclosure will be more clearly understood from the following detailed description and the accompanying drawings, in which.

DESCRIPTION OF EXEMPLARY EMBODIMENTS

Figure 1:
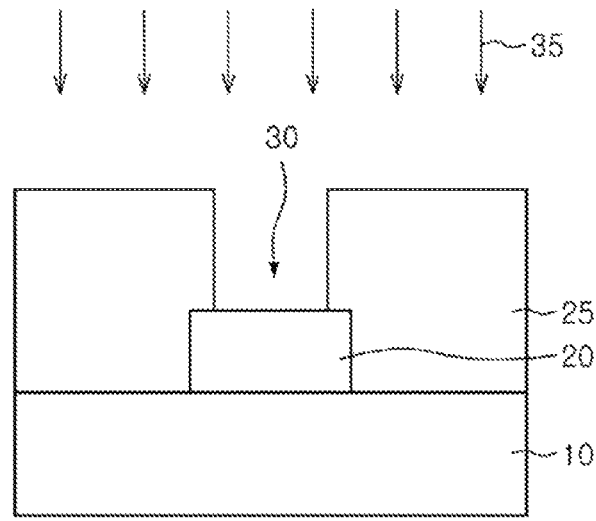
FIGS. 1 to 3 are cross-sectional views illustrating a method of fabricating a phase-change memory device according to exemplary embodiments of the inventive concept.

Exemplary embodiments are described herein with reference to the accompanying drawings. One of ordinary skill in the art should understand that variations from the shapes of the illustrations as a result, for example, of manufacturing techniques and/or tolerances, are to be expected. Thus, exemplary embodiments should not be construed as limited to the particular shapes of regions illustrated herein. In the drawings, lengths and sizes of layers and regions may be exaggerated for clarity, Like reference numerals in the drawings denote like elements. Herein, it should also be understood that when a layer is referred to as being "on" another layer or substrate, it can be directly on the other layer or substrate, or intervening layers may also be present.

Figure 2:
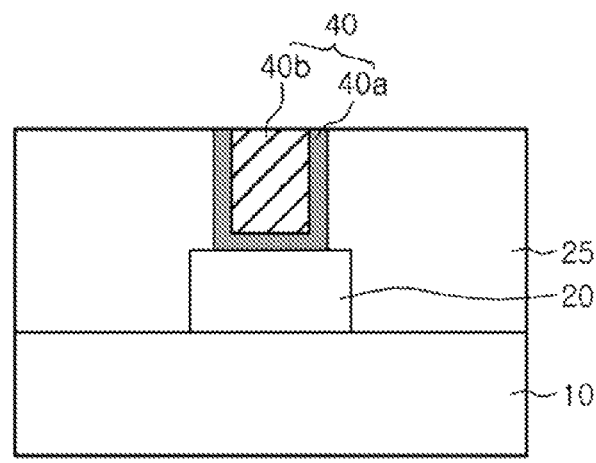
Figure 3:
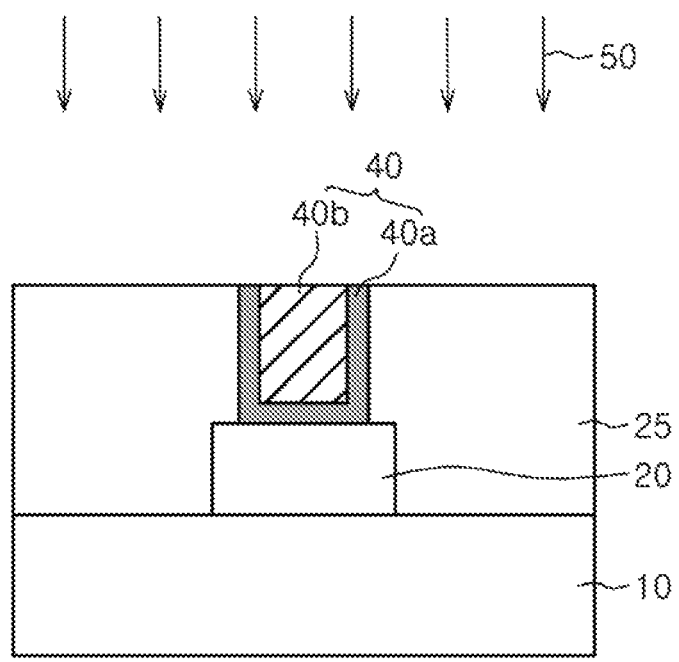

FIGS. 1 to 3 are cross-sectional views illustrating a method of fabricating a phase-change memory device according to an exemplary embodiment of the inventive concept.

Referring to FIG. 1, a lower electrode 20 is formed on a semiconductor substrate 10 of the phase-change memory device including a switching element. For example, a diode may be used as the switching element. But it is not limited thereto and a MOS transistor may be used as the switching element. In addition, the switching element may be electrically connected to a word line to supply a reset current to the lower electrode 20. The lower electrode 20 may be fabricated in various types so as to reduce the reset current. The lower electrode 20 may be formed of a conduction material of low resistivity. For example, the lower electrode 20 may include at least one selected from the group consisting of a polysilicon germanium (poly-SiGe) layer, a germanium nitride (GeN) layer, a titanium nitride (TiN) layer, a titanium aluminum nitride (TiAlN) layer, a titanium silicon nitride (TiSiN) layer, a titanium oxynitride (TiON) layer, a titanium oxide ($TiO_2$) Dyer, a tantalum (Ta) layer, a tantalum nitride (TaN) layer, a tantalum silicon nitride (TaSiN) layer, a tantalum oxide ($Ta_2O_5$) layer, a tungsten (W) layer, a tungsten nitride (WN) layer, a gold (Au) layer, a cupper (Cu) layer, an iridium (Ir) layer, an iridium oxide (IrOx) layer and a platinum (Pt) layer.

An interlayer insulating layer 25 is formed on the semiconductor substrate 10 which the lower electrode 20 is formed on. The interlayer insulating layer 25 may be a silicon nitride-based insulating layer having excellent heat-endurance. The interlayer insulating layer 25 is etched to expose the lower electrode 20, thereby defining a phase-change area 30.

A pre-treatment process 35 for a resultant structure of the semiconductor substrate 10 is performed to improve a deposition characteristic of a phase-change layer which is to be formed in the following/subsequent process. The pre-treatment process 35 prevents a material constituting the lower electrode 20 from outgassing to improve adhesion and deposition characteristics of the phase-change layer, which is subsequently formed. The pre-treatment process 35 may include a furnace process a rapid thermal annealing (RTA) process, a UV bake process, a chamber annealing process, etc.

Referring to FIG. 2, a phase-change layer 40 is formed to fill the phase-change area 30. In an exemplary embodiment, the phase-change layer 40 includes a first phase-change layer 40a having excellent coating uniformity and a second phase-change layer 40b having excellent deposition selectivity. That is, the first phase-change layer 40a is a film which is relatively uniformly deposited along a resultant structure of the semiconductor substrate 10. The first phase-change layer 41a may be formed of a hetero/binary compound comprised of a first material and a second material, one of which may be material-rich, For example, the first phase-change layer 40a may be formed of a compound comprised of Sb-rich Te, Ge-rich Te, or Si-rich Sb. Herein, the term "material-rich" denotes that the material is included over stoichiometry in the compound.

Herein, the first phase-change layer 40a may be a film relatively thinner than the second phase-change layer 40b. In addition, the first phase-change layer 40a may be deposited by an atomic layer deposition (ALD) method having excellent surface deposition characteristic. According to the ALD method, the first phase-change layer 40a may be formed by repeatedly performing a cycle, including supplying the first material, purging, supplying the second material, and purging. Herein, as the first phase-change layer 40a, a first material-rich phase-change layer may be formed by supplying the first material relatively longer than the second material. As the ALD method deposits a material layer in an atom unit, that is, in a type of an atomic layer, it has excellent step coverage and it is able to control a thickness of the material layer easily. In addition, as the ALD method is able to deposit the material layer at a lower temperature, the first phase-change layer 40a can be deposited without variation of material properties.

Herein, a metal organic precursor may be used as the first material of the first material-rich first phase-change layer 40a. In the case where the first material is antimony (S), an antimony precursor including a nitrogen (N) ligand may be used. The nitrogen ligand has electronegativity larger than a carbon (C) ligand to withdraw an electron easily. Therefore, the repulsive force between the nitrogen and the antimony increases and their bonding is broken to cause the chemical reaction. Accordingly, the deposition is uniformly accomplished.

Meanwhile, the second phase-change layer 40b may be comprised of a Ge—Sb—Te (GST) material. For example, the second phase-change layer 40b may be deposited by an ALD method or a chemical vapor deposition (CVD) method. According to the ALD method, the second phase-change layer may be deposited by repeatedly performing a cycle, including supplying a first material, purging, supplying a second material, purging, supplying a third material, and purging. The first to third materials may be different from each other, and may be any one of germanium (Ge), antimony (Sb), and Tellurium (Te). In addition, bismuth (Bi), silicon (Si), arsenic (As), or selenium (Se) may be supplied as any one of the first and third materials.

Alternatively, according to the ALD method, the second phase-change layer 40b may be deposited by repeatedly performing a cycle, including supplying a hetero compound source including the first material and the second material, purging, supplying the third material, and purging.

Furthermore, according to the ALD method, the second phase-change layer may be formed by repeatedly performing a cycle, including supplying a ternary compound source, which includes the first to third materials, and purging.

According to the CVD method, the second phase-change layer 40b may be deposited by supplying the first to third materials individually. Alternatively, the second phase-change layer 40b may be deposited by supplying the first to third materials in a hetero compound type or in a ternary compound type. When the second phase-change layer 40b is deposited by the CVD method, $NH_3$ and $H_2$ gases may be injected as a reactant gas. In addition, plasma may be further supplied to improve a reaction characteristic.

Furthermore, the first and second phase-change layers 40a and 40b may include a dopant, respectively. For example, tin (Sn), silicon oxide (SiO2), or silicon (Si) may be used as the dopant included in the first or second phase-change layer 40a or 40b.

Then, the second and first phase-change layers 40b and 40a are planarized to form the confined phase-change layer 40.

Referring to FIG. 3, the phase-change layer 40 is post-treated. The post-treatment process may include an RTA process, a UV bake process, a chamber annealing process or a plasma treatment process. At this time, in the case of the plasma treatment process, a phase of a phase-change material can be controlled to prevent volume reduction. In addition, the post-treatment process can remove by-products due to process reaction and improve a contact characteristic with an upper electrode (not shown) which is to be formed on the phase-change layer 40. The post-treatment process may be preferably performed at a temperature of 200 to 400 degrees which do not affect the material property of the phase-change layer 40.

According to the inventive concept, as a phase-change layer of a phase-change memory device, a first phase-change layer which is comprised of a specific material-rich hetero compound is deposited to enhance the coating uniformity of the phase-change layer and then a second phase-change layer, which includes a phase-change material having excellent deposition selectivity, is deposited. According to this, when the phase-change layer having a confined structure as well as various structures is deposited, its deposition characteristic can be improved.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a phase-change memory device, comprising:
   forming a phase-change area having a hole type exposing a lower electrode formed on a semiconductor substrate;
   uniformly forming a first material-rich first phase-change layer comprised of a hetero compound of the first material and a second material only on sidewalls and bottom of the phase-change area; and
   forming a second phase-change layer on a surface of the first phase-change layer to fill the phase-change area.

2. The method of claim 1, wherein the forming of the phase-change area includes:
   forming an interlayer insulating layer on the semiconductor substrate with the lower electrode; and
   forming the phase-change area in the interlayer insulating layer by etching a portion of the interlayer insulating layer to expose an upper portion of the lower electrode.

3. The method of claim 1, wherein the first phase-change layer is formed by an atomic layer deposition (ALD) method.

4. The method of claim 3, wherein the forming of the first phase-change layer includes:
   supplying a first material to be deposited in a type of an atomic layer;
   purging a resultant structure of the semiconductor substrate;
   supplying a second material to be deposited in a type of an atomic layer; and
   purging a resultant structure of the semiconductor substrate.

5. The method of claim 4, wherein the supplying of the first material is performed relatively longer than the supplying of the second material.

6. The method of claim 5, wherein a metal organic precursor is used as the first material.

7. The method of claim 6, wherein an antimony precursor including a nitrogen ligand is used as the first material.

8. The method of claim 1, wherein the second phase-change layer is formed by an atomic layer deposition (ALD) method or a chemical vapor deposition (CVD) method.

9. The method of claim 8, wherein the second phase-change layer is formed using sources including third to fifth materials, respectively.

10. The method of claim 8, wherein the second phase-change layer is formed using a mixed source including third and fourth materials and a source including a fifth material.

11. The method of 8, wherein the second phase-change layer is formed using a mixed source of third to fifth materials.

12. The method of claim 1, further comprising performing a pre-treatment process to improve adhesion characteristics of the first and second phase-change layers, before the forming of the first phase-change layer.

13. The method of claim 12, wherein the pre-treatment process includes a furnace process, a rapid thermal annealing (RTA) process, an ultraviolet (UV) bake process and a chamber annealing process.

14. The method of claim 1, further comprising performing a post-treatment process, after the forming of the second phase-change layer.

15. The method of claim 14, wherein the post-treatment process includes a rapid thermal annealing (RTA) process, an ultraviolet (UV) bake process, a chamber annealing process and a plasma treatment.

16. The method of claim 1, wherein at least one of the first and second phase-change layers includes a dopant.

* * * * *